(12) United States Patent
Yamashita

(10) Patent No.: US 11,290,082 B2
(45) Date of Patent: Mar. 29, 2022

(54) TUNING FORK-TYPE PIEZOELECTRIC VIBRATION PIECE AND TUNING FORK-TYPE PIEZOELECTRIC VIBRATOR USING THE VIBRATION PIECE

(71) Applicant: DAISHINKU CORPORATION, Kakogawa (JP)

(72) Inventor: Hiroaki Yamashita, Kakogawa (JP)

(73) Assignee: DAISHTNKU CORPORATION, Hyogo (JP)

( * ) Notice: Subject to any disclaimer, the term of this patent is extended or adjusted under 35 U.S.C. 154(b) by 266 days.

(21) Appl. No.: 16/481,961

(22) PCT Filed: Mar. 22, 2018

(86) PCT No.: PCT/JP2018/011343
§ 371 (c)(1),
(2) Date: Jul. 30, 2019

(87) PCT Pub. No.: WO2018/180861
PCT Pub. Date: Oct. 4, 2018

(65) Prior Publication Data
US 2020/0014367 A1 Jan. 9, 2020

(30) Foreign Application Priority Data
Mar. 30, 2017 (JP) .............................. JP2017-066798

(51) Int. Cl.
*H03H 9/215* (2006.01)
*H03H 9/10* (2006.01)
(Continued)

(52) U.S. Cl.
CPC .......... *H03H 9/215* (2013.01); *H03H 9/1021* (2013.01); *H03H 9/132* (2013.01); *G04C 3/12* (2013.01)

(58) Field of Classification Search
CPC ...... H03H 9/215; H03H 9/1021; H03H 9/132; G04C 3/12
See application file for complete search history.

(56) References Cited

U.S. PATENT DOCUMENTS

2011/0221311 A1 9/2011 Iwai
2013/0249352 A1* 9/2013 Arimatsu ................. H03H 9/21
310/366

FOREIGN PATENT DOCUMENTS

JP 53-60594 A 5/1978
JP 2004-129181 A 4/2004
(Continued)

OTHER PUBLICATIONS

Machine Translation of JP 2014179706.*

*Primary Examiner* — Jeffrey M Shin
(74) *Attorney, Agent, or Firm* — Norris McLaughlin, P.A.

(57) ABSTRACT

Main surface electrodes formed on main surfaces on front and back sides of vibrating arms are electrically coupled via through electrodes formed in a stem portion so as to penetrate through front and back surfaces thereof. One of the main surface electrodes of the vibrating arm is electrically coupled to side surface electrodes through a routing wiring formed by way of a crotch part between roots of the vibrating arms, and the one of the main surface electrodes is further electrically coupled to the other one of the main surface electrodes through the side surface electrodes.

3 Claims, 8 Drawing Sheets

(51) Int. Cl.
*H03H 9/13* (2006.01)
*G04C 3/12* (2006.01)

(56) References Cited

FOREIGN PATENT DOCUMENTS

| | | |
|---|---|---|
| JP | 2004-200914 A | 7/2004 |
| JP | 2006-005970 A | 1/2006 |
| JP | 2006-262289 A | 9/2006 |
| JP | 2010-010734 A | 1/2010 |
| JP | 2011-014977 A | 1/2011 |
| JP | 2011-216924 A | 10/2011 |
| JP | 5333668 B2 | 11/2013 |
| JP | 2014-045255 A | 3/2014 |
| JP | 2014-107817 A | 6/2014 |
| JP | 2014-179706 A | 9/2014 |
| JP | 2014-179902 A | 9/2014 |
| JP | 5831353 B2 | 12/2015 |

* cited by examiner

TUNING FORK-TYPE PIEZOELECTRIC VIBRATION PIECE AND TUNING FORK-TYPE PIEZOELECTRIC VIBRATOR USING THE VIBRATION PIECE

TECHNICAL FIELD

The present invention relates to a tuning fork-type piezoelectric vibrator which is typically used, as clock source, in devices including watches.

BACKGROUND ART

In a tuning fork-type crystal vibrator, a tuning fork-type crystal vibration piece 7 (hereinafter, vibration piece 7), an example of which is illustrated in FIG. 9, is joined with use of a joining material to the interior of a box-shaped container having an opening on its upper side (not illustrated in the drawing), and the opening of the container is air-tightly sealed with a flat lid (not illustrated in the drawing). Of main surfaces on front and back sides of the vibration piece 7, surfaces illustrated in FIG. 9 are defined herein as the front main surfaces.

As illustrated in FIG. 9, the vibration piece 7 includes a stem portion 8, a pair of vibrating arms 91 and 92, and a protruding portion 9. The vibrating arms 91 and 92 are formed so as to extend in the same direction from one end side of the stem portion 8. The protruding portion 9 is formed so as to protrude from a side surface on the other end side of the stem portion 8 in a direction along the width of the stem portion 8 (direction along X axis among crystallographic axes X, Y, and Z of crystal orthogonal to one another in FIG. 9). The vibrating arms 91 and 92 respectively have, on their tip-end sides, widened portions 93 greater in width than the vibrating arms 91 and 92. On these widened portions 93 are formed metal films W that serve as weights for frequency adjustment.

The vibration piece 7 has first driving electrodes 11 and second driving electrodes 12 heteropolar to each other, and extraction electrodes 13 and 14. The extraction electrodes 13 and 14 are respectively extracted from the first and second driving electrodes 11 and 12 through routing electrodes described later. The front and back main surfaces of the vibrating arms 91 and 92 have elongated grooves G, which are formed to lower the equivalent series resistance value (crystal impedance value: CI value).

Referring to FIG. 9, the first driving electrode 11 formed on the front main surface of the vibrating arm 91 is extracted through the routing electrode 13 to a peripheral area of a through hole H3 formed in the stem portion 8, while the second driving electrode 12 formed on the front main surface of the vibrating arm 91 is extracted by the routing electrode 14 to a peripheral area of a through hole H4 formed in the stem portion 8. The second driving electrode 12 is further extracted from the peripheral area of the through hole H4 through the extraction electrode 14 and is coupled to the second driving electrode 12 formed on an outer side surface of the vibrating arm 91.

In the vibrating arm 91, 92, on its whole circumference including the side surfaces and main surfaces constituting the widened portion 93, a routing electrode (no reference sign) is formed that allows electrical connection between the homopolar driving electrodes formed on outer and inner side surfaces of the vibrating arm connected to the widened portion 93.

The second driving electrode 12 formed on the outer side surface of the vibrating arm 91 is coupled to the second driving electrode 12 formed on the inner side surface of the vibrating arm 91 through the second driving electrode 12 on the whole circumference of the widened portion 93. Similarly, the first driving electrode 11 formed on the outer side surface of the vibrating arm 92 is coupled to the first driving electrode 11 formed on the inner side surface of the vibrating arm 92 through the first driving electrode 11 formed on the whole circumference of the widened portion 93.

In FIG. 9, the first driving electrode 11 formed on the front main surface of the vibrating arm 91 is extracted to and not any farther than the peripheral area of the through hole H3, whereas the second driving electrode 12 formed on the front main surface of the vibrating arm 92 is extracted to the peripheral area of the through hole H4 and is further extracted to the second driving electrode 12 on the outer side surface of the vibrating arm 91.

On the back main surfaces opposite to the front main surfaces illustrated in FIG. 9, the first driving electrode 11 formed on the back main surface of the vibrating arm 91 is extracted to the peripheral area of the through hole H3 and is further extracted to the first driving electrode 11 on the outer side surface of the vibrating arm 92, whereas the second driving electrode 12 formed on the back main surface of the vibrating arm 92 is extracted to and not any farther than the peripheral area of the through hole H4.

Thus, the first driving electrode 11 formed on the front main surface of the vibrating arm 91 is not extracted any farther than the peripheral area of the through hole H3. Similarly, the second driving electrode 12 formed on the back main surface of the vibrating arm 92 is not extracted any farther than the peripheral area of the through hole H4.

The through hole H3, H4; electrode, is a hole penetrating through the stem portion 8 in its thickness direction is coated with a metal film.

The first driving electrode 11 formed on the front main surface of the vibrating arm 91 is coupled to the first driving electrode 11 formed on the back main surface through the through hole H3 and is also coupled to the first driving electrodes 11 formed on the outer and inner side surfaces of the vibrating electrode 92.

Similarly, the second driving electrode 12 formed on the back main surface of the vibrating arm 92 is coupled to the second driving electrode 12 formed on the front main surface of the vibrating electrode 92 through the through hole H4 and is also coupled to the second driving electrodes 12 formed on the outer and inner side surfaces of the vibrating electrode 91.

Patent documents 1 to 3 describe such tuning fork-type piezoelectric vibration pieces having penetrating holes in their stem portions.

CITATION LIST

Patent Documents

Patent document 1: Japanese Patent Application Publication No. 2004-200914
Patent document 2: Japanese Patent No. 5333668
Patent document 3: Japanese Patent No. 5831353

SUMMARY OF THE INVENTION

Technical Problems

To form a penetrating hole that constitutes the through hole, a metal film is formed on a crystal wafer and subjected to photolithography so as to remove a predetermined region alone of the metal film, and any other region is used as a protective mask during etching. When the crystal wafer with the protective film formed thereon is then immersed in a crystal-corrodible solution (etching solution) of, for example, ammonium hydrogen fluoride, a portion of the crystal uncoated with the protective film is chemically dissolved (wet etching), and the penetrating hole may be formed by controlling duration of the immersion.

When the crystal wafer (Z plate) made of synthetic crystal is immersed in the etching solution, because of its crystal anisotropy, the corrosion advances in a direction of thickness of the crystal wafer through an angle of inclination specific to the Z-plate crystal, which consequently forms a penetrating hole including an inclined surface 16 on its inner wall, as illustrated in FIG. 9. As the crystal wafer is increased in thickness, therefore, the penetrating hole formed therein may often result in a smaller opening size. Further, an opening 15 of the penetrating hole, as illustrated in FIG. 9, may have a polygonal shape in plan view, for example, a substantially triangular shape.

Thus, inside of the penetrating hole may become smaller than its openings sides on the front and back main surfaces of the crystal wafer.

In response to increasingly miniaturized piezoelectric devices in recent years, vibration pieces sealed in these devices are also correspondingly miniaturized. Smaller outer dimensions of the tuning fork-type vibrators in plan view, for example, 1.6 mm×1.0 mm or less, coupled with variability of the wet etching, may often lead to difficulty in forming an adequately large opening in the penetrating hole. Assuming that the wet etching simultaneously starts on the front and back main surfaces of the crystal wafer and advances further inward, a decreasing tendency of the opening size may be somewhat mitigated, as compared with unidirectional wet etching that advances from the side of on one main surface alone of the crystal wafer. Yet, it still remains difficult to ensure an adequately large opening size.

When the through hole is formed in such a penetrating hole smaller small in its opening size, electrical conduction may be rendered unstable in an edge of the penetrating hole depending on whether the opening area of the penetrating hole is large enough and/or whether the metal film is adhered well to the inclined surface of the through hole. This may often cause breakage of electrical connection in the penetrating hole during a reflow or insulation inspection, resulting in unqualified products out of frequency specs.

The present invention was accomplished to address the issues of the known art, and is directed to providing a miniaturized tuning fork-type piezoelectric vibration piece that successfully prevents conduction failure and excels in stability of characteristics, and a tuning fork-type vibrator using the vibration piece.

Solutions to Problem

To this end, the present invention provides the following technical aspects.

The present invention provides a tuning fork-type piezoelectric vibration piece, including a stem portion, and first and second vibrating arms formed so as to extend in a pair in a direction from one end side of the stem portion.

One of main surface electrodes formed on main surfaces on front and back sides of the first vibrating arm is coupled to another one of the main surface electrodes formed on the main surfaces of the first vibrating arm through one of through electrodes that are formed in a pair in the stem portion in a direction of thickness thereof, and the one of the main surface electrodes of the first vibrating arm is coupled to side surface electrodes that are formed in a pair, respectively, on an outer side surface and an inner side surface of the second vibrating arm through a routing wiring formed by way of a crotch part between roots of the first and second vibrating arms extending from the stem portion.

One of main surface electrodes formed on main surfaces on front and back sides of the second vibrating arm is coupled to another one of the main surface electrodes of the second vibrating arm through another one of the through electrodes, the one of the main surface electrodes of the second vibrating arm being formed on the main surface on one of the front and back sides opposite to the front or back side where the one of the main surface electrodes of the first vibrating arm is formed.

The one of the main surface electrodes of the second vibrating arm is coupled to side surface electrodes that are formed in a pair, respectively, on an outer side surface and an inner side surface of the first vibrating arm via a routing wiring formed by way of the crotch part.

The another one of the main surface electrodes of the first vibrating arm is coupled to the side surface electrodes on the outer and inner side surfaces of the second vibrating arm.

The another one of the main surface electrodes of the second vibrating arm is coupled to the side surface electrodes on the outer and inner side surfaces of the first vibrating arm.

The present invention thus characterized may ensure reliable electrical conduction, even in a miniaturized tuning fork-type crystal vibration piece, between electrodes respectively formed on front and back main surfaces of vibrating arms.

The reliable electrical conduction is thus possible, because of the following reasons:

the main surface electrodes on the front and back sides of each vibrating arm are electrically coupled to each other through one of the through electrode that are formed on a pair so as to penetrate through the stem portion;

one of the main surface electrodes on the front and back sides of one of the vibrating arm is electrically coupled, through the routing wiring formed in the crotch part, to the side surface electrodes that are formed in a pair on the outer and inner side surfaces of the other vibrating arm; and the paired side surface electrodes are electrically coupled to the other one of the main surface electrodes on the front and back sides.

Supposing that electric conduction is destabilized or breakage of electrical connection occurs as a result of production variability in one or both of the through electrodes, electrical connection may be successfully maintained between the main surface electrodes on the front and back sides of the vibrating arms through the routing wirings; conduction paths, formed by way of the crotch part.

In one or both of the paired routing wirings formed on the front and back main surfaces by way of the crotch part, pattern displacement may possibly occur as a result of misregistration during photolithographic exposure. Such an event possibly destabilizes electrical conduction or invites breakage of electrical connection. Yet, the paired routing wirings may allow electrical connection to be successfully maintained between the main surface electrodes on the front and back sides of the vibrating arms.

The through electrodes formed on front and back main surfaces of the stem portion may preferably have a substantially circular shape in plan view.

In case wet etching using an etching solution is employed to form the outer shape of a tuning fork-type piezoelectric vibration piece from a piezoelectric wafer, a hole used to form a through electrode may have a polygonal shape in plan view. The equivalent series resistance is desirably lower with further miniaturization of tuning fork-type piezoelectric vibration pieces, which is increasing the need for wet etching to form elongated grooves in main surfaces of vibrating arms. The wet etching additionally performed may allow the polygonal penetrating hole in plan view to have a greater opening size.

In the wet etching additionally performed, a metal film is formed by patterning so that has an opening large enough to substantially circumscribe the planar polygonal shape of the penetrating hole. The polygonal shape of the penetrating hole at is opening end in plan view may be transformed into a substantially circular or triangular shape in accordance with the shape of the metal film's opening in plan view.

In the technical aspect described earlier, the through electrodes formed on the front and back main surfaces of the stem portion have a substantially circular shape in plan view. The metal film's opening in plan view may have a substantially circular shape substantially circumscribing the planar polygonal shape of the penetrating hole in plan view.

Thus, the metal film is formed by patterning to allow the metal film's opening to have a substantially circular shape that substantially circumscribes the planar polygonal shape of the penetrating hole. This may prevent unnecessary increase of the planar polygonal opening of the penetrating hole when elongated grooves are formed in the main surfaces by additional wet etching and may achieve a minimized area of the penetrating hole formed in the stem portion of the miniaturized tuning fork-type piezoelectric vibration piece.

A tuning fork-type piezoelectric vibrator according to the present invention includes the tuning fork-type piezoelectric vibration piece according to the present invention, and a package in which the tuning fork-type piezoelectric vibration piece is housed.

The tuning fork-type piezoelectric vibration piece has electrodes for connection extracted from driving electrodes including the main surface electrodes and the side surface electrodes of the first and second vibrating arms. The electrodes for connection are conductively coupled to electrodes mounted in a base constituting the package, and the tuning fork-type piezoelectric vibration piece is air-tightly sealed in the package.

The present invention may ensure, even in miniaturized tuning fork-type piezoelectric vibration pieces, reliable electrical conduction between electrodes on front and back main surfaces.

Effects of the Invention

As described so far, the present invention may offer a compact and miniaturized tuning fork-type piezoelectric vibration piece that successfully prevents conduction failure and excels in stability of characteristics, and a tuning fork-type vibrator using the vibration piece.

EMBODIMENTS OF THE INVENTION

Embodiments of the present invention are hereinafter described in detail, in which a tuning fork-type crystal vibrator is described by way of example.

Figure 1:
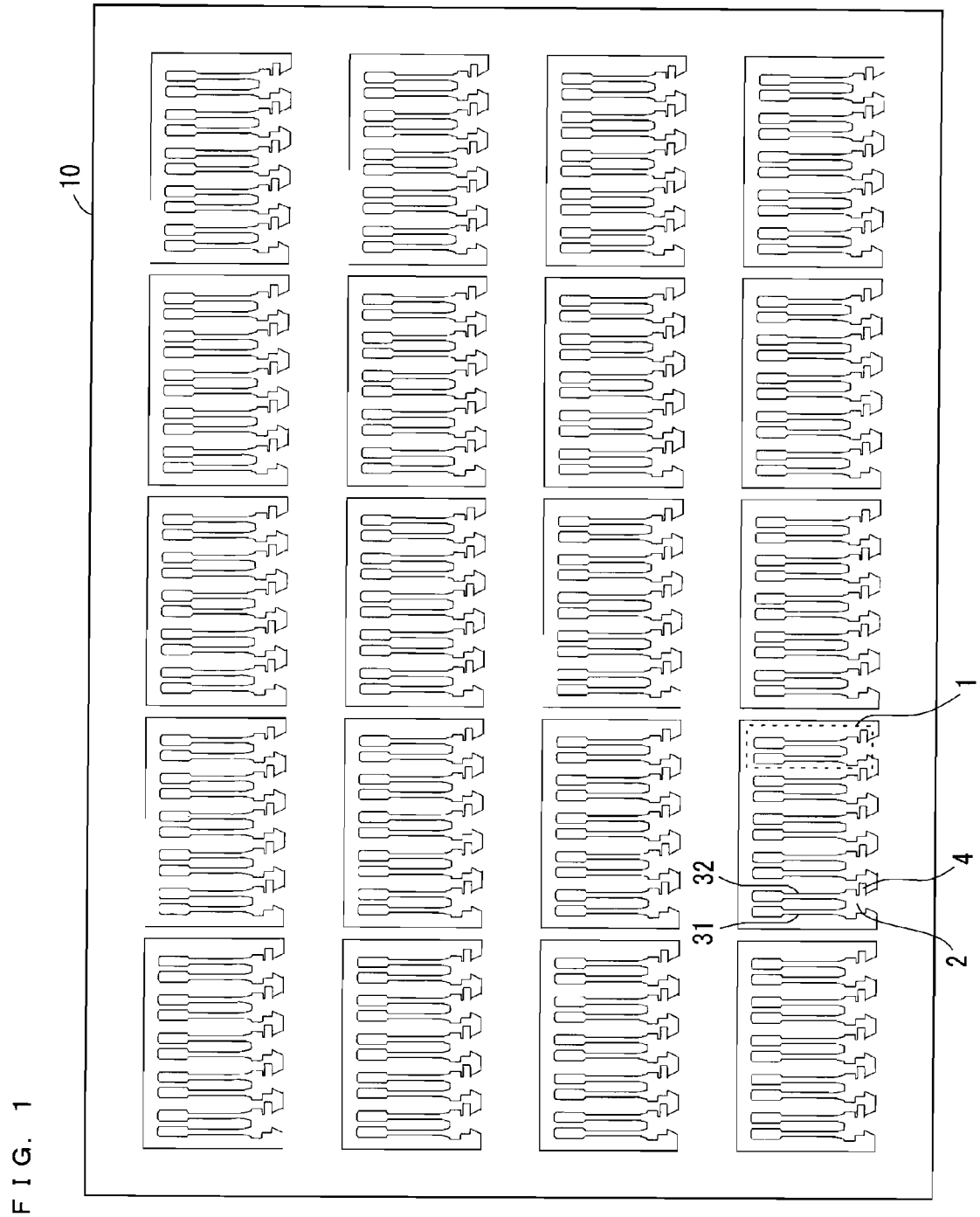
FIG. 1 is a schematic plan view of an assembly of tuning fork-type crystal vibration pieces according to an embodiment of the present invention.

FIG. 1 is a schematic plan view of an assembly of tuning fork-type crystal vibration pieces (hereinafter, may be simply referred to as vibration piece) according to an embodiment of the present invention.

The vibration pieces 1 each include a stem portion 2, a pair of vibrating arms 31 and 32, and a protruding portion 4. These multiple vibration pieces 1 are collectively obtained at once from a sheet of crystal wafer 10 (hereinafter, may be simply referred to as wafer) having a rectangular shape in plan view. FIG. 1 simply shows outer shapes of the vibration pieces 1 alone, while omitting details including penetrating holes formed in the stem portions 2 of the respective vibration pieces 1, grooves formed in front and back main surfaces of the vibrating arms 31 and 32, and electrodes formed in the vibrating arms 31 and 32 and stem portions 2.

Figure 2:
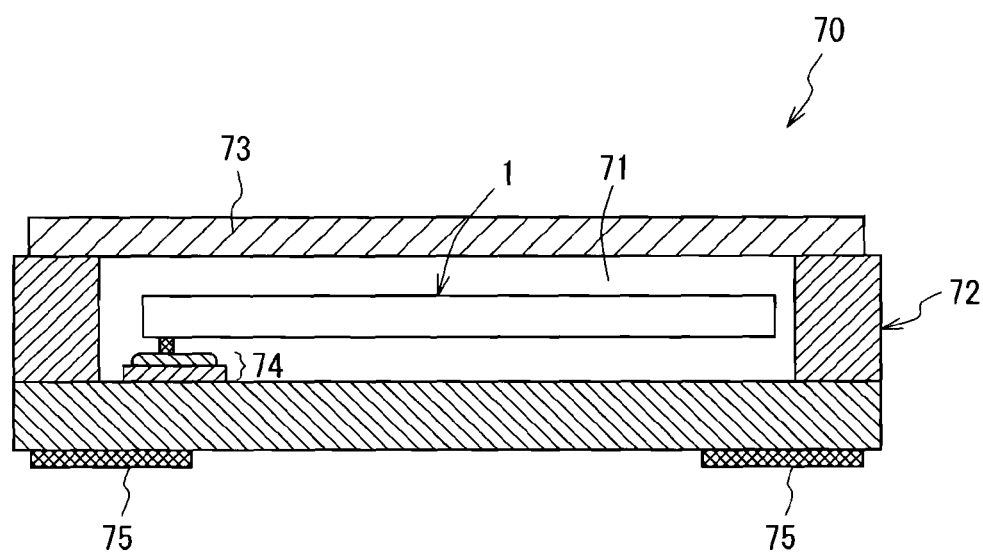
FIG. 2 is a schematic cross-sectional view of a tuning fork-type crystal vibrator according to an embodiment of the present invention.

FIG. 2 is a schematic cross-sectional view of a tuning fork-type crystal vibrator in which the vibration piece 1 is housed.

The tuning fork-type crystal vibrator according to this embodiment (hereinafter, may be simply referred to as crystal vibrator) is a crystal vibrator 70 of surface mounting type including a substantially cuboidal package. In this embodiment, the crystal vibrator 70 has outer dimensions in plan view of 1.6 mm (long side) and 1.0 mm (short side). The crystal vibrator 70, however, does not necessarily have such dimensions and may be formed in smaller sizes. The crystal vibrator 70 may have outer dimensions in plan view of, for example, 1.2 mm (long side)×1.0 mm (short side).

The crystal vibrator 70 according to this embodiment includes a container 72 made of an insulating material and having a recessed portion 71, a vibration piece 1, and a lid member 73 in the form of a flat plate that seals the recessed portion 71. The container 72 and the lid member 73 constitute the package for the vibration piece 1 to be housed. After the vibration piece 1 is housed in the recessed portion 71 of the container 72, the lid member 73 is joined to the opening end of the container 72 to close the recessed portion 71. Thus, the vibration piece 1 is air-tightly sealed in the package. The container 72 and the lid member 73 are joined to each other with a sealing member not illustrated in the drawings. Electrodes of the vibration piece 1 are not illustrated in FIG. 2.

The container 72 is a two-layered member in the form of a box made of a ceramic-based insulating material, for example, alumina. Two pieces of ceramic green sheets are stacked in layers and sintered to form the container 72. Two electrode pads 74 (FIG. 2 shows one electrode alone), which are electrodes mounted to be conductively joined to the vibration piece 1, are formed at positions spaced apart on an inner bottom surface along one short side of the recessed portion 71 rectangular in plan view. The two electrode pads 74 are electrically coupled to two of four external terminals for connection 75 (FIG. 2 shows two terminals electrodes alone) disposed at four corners on an outer bottom surface of the container 72 through an internal wiring and via members not illustrated in the drawing. The two electrode pads 74 are heteropolar to each other.

In this embodiment, the two electrode pads 74 are formed by, for example, depositing gold by plating on an upper surface of a tungsten metallized layer. The material of the metallized layer may be molybdenum instead of tungsten.

The lid member 73 is a metallic member including Kovar as its base material and has a rectangular shape in plan view. The lid member 73 includes nickel-plated layers that are formed on its both surfaces.

In this embodiment, the nominal frequency of the crystal vibrator 70 is 32.768 kHz.

Figure 3:
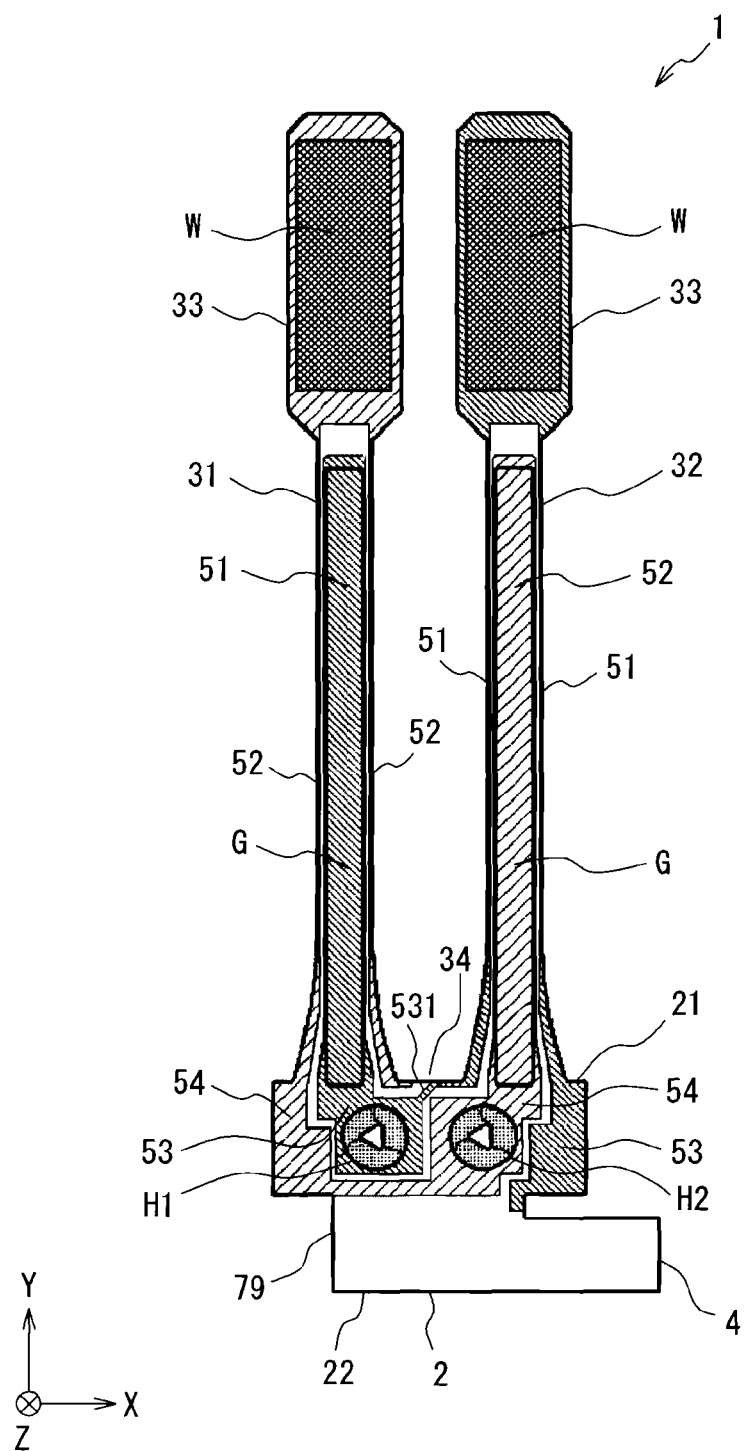
FIG. 3 is a schematic plan view of one main surface side of the tuning fork-type crystal vibration piece illustrated in FIG. 2.
Figure 4:
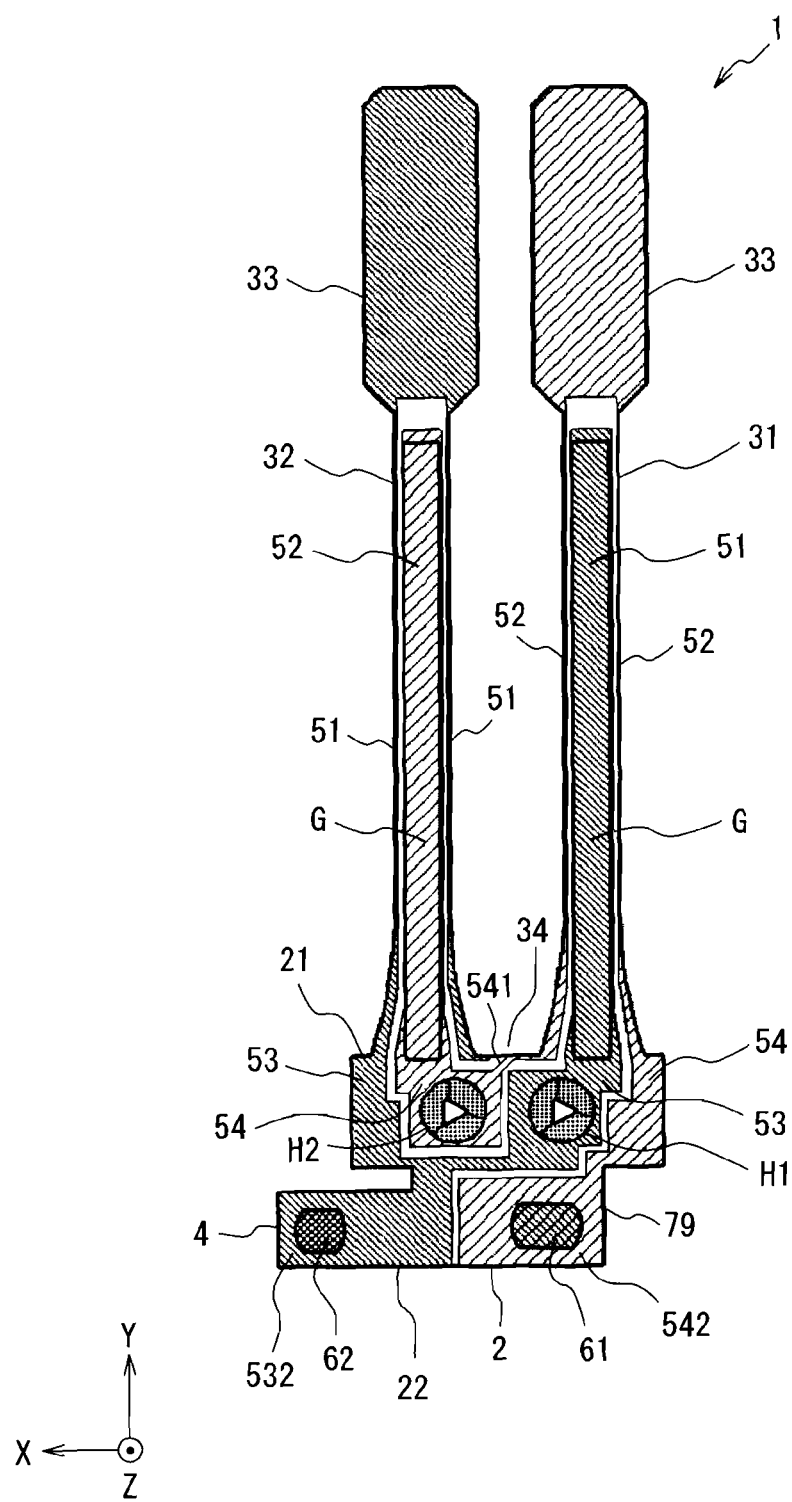
FIG. 4 is a schematic plan view of another main surface side of the tuning fork-type crystal vibration piece illustrated in FIG. 2.

FIG. 3 is a schematic plan view of one main surface side of the vibration piece 1. FIG. 4 is a schematic plan view of another main surface side of the crystal vibration piece 1. As described herein, a back main surface refers to a surface of the vibration piece 1 that faces the electrode pad 74 of the container 72 when the vibration piece 1 is mounted in the container 72, and a front main surface refers to the other surface of the vibration piece 1 opposite to the back main surface. FIG. 3 shows the front main surface side, while FIG. 4 shows the back main surface side of the vibration piece 1.

The vibration piece 1 of this embodiment has a stem portion 2, vibrating arms 31 and 32; first and second vibrating arms formed in a pair, both extending in the same direction from one end side 21 of the stem portion 2, and a protruding portion 4 extending from one side surface on the other end side 22 of the stem portion 2 in a direction of width of the stem portion 2 (direction along X axis among crystallographic axes X, Y, and Z of crystal orthogonal to one another illustrated in FIGS. 3 and 4).

The vibrating arms 31 and 32 respectively have widened portions 33 greater in width than the vibrating arms in a direction orthogonal to a direction of extension of these arms (direction along X axis in FIGS. 3 and 4). The widened portions 33 are integral with tip ends of the vibrating arms 31 and 32 with wider parts (no reference symbol) interposed therebetween.
The wider parts are increased by degrees in width along the direction of extension of the vibrating arms. The vibrating arm 31, 32, wider part, and widened portion 33, 33 have a pair of opposing main surfaces and a pair of opposing side surfaces (no reference symbol).

The front and back main surfaces of the vibrating arms 31 and 32 have elongated grooves G formed so as to face each other for the purpose of further reducing the equivalent series resistance value, i.e., crystal impedance (hereinafter, maybe referred to as CI value).

The stem portion 2 has a narrower part 79, in which the stem portion 2 is smaller in width on the other end side 22 than one end side 21. The protruding portion 4 described earlier is formed on one side surface of the narrower part 79. The protruding portion 4 and the stem portion 2 form an "L"-shaped portion bent at the right angle in plan view. As illustrated in FIG. 4, joining materials 61 and 62 are formed on the back surface side of the stem portion 2 as described later, which are used for joining to the electrode pads 74 of the container 72 that are mounted in the container 72.

Figure 5:
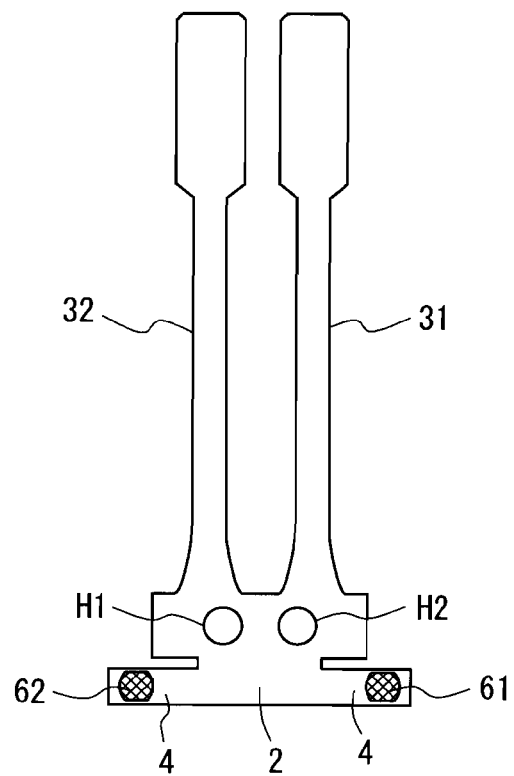
FIG. 5 is a drawing that illustrates the outer shape of a tuning fork-type crystal vibration piece including a modified joining portion.
Figure 6:
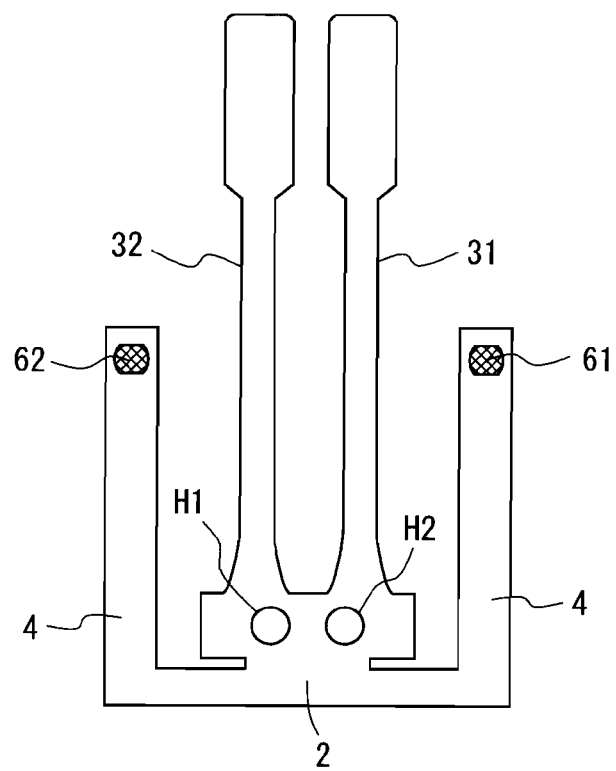
FIG. 6 is a drawing that illustrates the outer shape of a tuning fork-type crystal vibration piece including another modified joining portion.

The vibration piece is not necessarily structured as described in this embodiment. In one example, the protruding portion 4 may protrude not only from one side surface of the stem portion 2 but also from the other side surface of the stem portion 2 (side surface on the opposite side of the one side surface), i.e., the protruding portion 4 may be formed so as to protrude from outward from two sides of the stem portion 2, as in the outer shape illustrated in FIG. 5. In another example, the protruding portion 4 may protrude outward from two sides of the stem portion 2, and then turns is direction toward the extension of the vibrating arm 31, 32 and symmetrically extends in parallel to each other, as in the outer shape illustrated in FIG. 6. FIGS. 5 and 6 are schematic drawings of the backs surface side of the vibration piece, which also shows outer shapes of through holes H1 and H2 describe later.

The outer shape and grooves of the vibration piece 1 described earlier are collectively obtained at once from a sheet of crystal wafer by photolithography in combination with wet etching with an etching solution used to chemically dissolve crystal.

The vibration piece 1 has first and second driving electrodes 51 and 52 heteropolar to each other, and extraction electrodes 53 and 54 extracted from the first and second driving electrodes 51 and 52 by way of routing electrodes described later.

The formation area of the first and second driving electrodes 51 and 52 includes interiors of the elongated grooves G formed in the vibrating arms 31 and 32. The elongated grooves G may suppress the risk of vibration leakage in the vibrating arms 31 and 32 regardless of size reduction of the vibration piece 1. As a result, a favorable CI value may be achieved.

The first driving electrode 51 is formed on front and back main surfaces of the vibrating arm 31; first vibrating arm, and is also formed on outer and inner side surfaces of the vibrating arm 32; second vibrating arm. Similarly, the second driving electrode 52 is formed on front and back main surfaces of the vibrating arm 32; second vibrating arm, and is also formed on outer and inner side surfaces of the vibrating arm 31; first vibrating arm. The driving electrodes that are formed in a pair on the front and back main surfaces of the vibrating arm are hereinafter referred to as main surface electrodes, while the driving electrodes that are formed in a pair on the outer and inner side surfaces of the vibrating arm are hereinafter referred to as side surface electrodes.

Routing electrodes (no reference symbol) are formed on all of the two side surfaces and the two main surfaces constituting the widened portion 33. The routing electrode is formed in the whole circumference of the widened portion 33 and in the circumference in part of the wider part, i.e., the routing electrode is formed all across two main surfaces and the two side surfaces.

The side surface electrodes 52 on the outer and inner side surfaces of the vibrating arm 31 are electrically coupled through the routing electrode formed in the whole circumference of the widened portion 33. Similarly, the side surface electrodes 51 on the outer and inner side surfaces of the vibrating arm 32 are electrically coupled through the routing electrode formed in the whole circumference of the widened portion 33.

In the first and second driving electrode 51, 52, extraction electrode 53, 54, and routing electrode (no reference symbol), a chrome (Cr) layer is formed on a crystal substrate, and a gold (Au) layer is further formed on the chrome layer. This layer structure, however, is just an example. The layers in these electrodes may be arranged otherwise.

The first and second driving electrodes 51 and 52, extraction electrodes 53 and 54, and the routing electrodes are collectively formed at once by shaping the crystal wafer, subsequent to film deposition using vacuum evaporation or sputtering, into desired patterns using photolithography and metal etching.

In this embodiment, an adjustment metal film W, which serves as a weight for frequency adjustment, is formed by electrolytic plating on one main surface alone of surfaces constituting the widened portion 33, specifically formed on a front main surface of the widened portion 33, as illustrated in FIG. 3. When the adjustment metal film W is irradiated with, for example, laser beam or ion beam and thereby reduced in mass, the frequency of the vibration piece 1 is adjustable. While this embodiment presents an example in which the adjustment metal film is formed on one main surface alone among the surfaces of the widened portion 33, the adjustment metal film may be formed on one main surface and the other main surface on the opposite side.

The extraction electrodes 53 and 54 are formed in part of the stem portion 2 on the front side, whole area of the stem portion 2 on the back side, and protruding portion 4 on the back side.

The main surface electrode 51 on the front side of the vibrating arm 31 illustrated in FIG. 3 is extracted through the extraction electrode 53 to the peripheral area of a through hole H1 formed in the stem portion 2.

Similarly, the main surface electrode 52 on the back side of the vibrating arm 32 illustrated in FIG. 4 is extracted through the extraction electrode 54 to the peripheral area of a through hole H2 formed in the stem portion 2.

The through hole H1, H2 is a through electrode formed by forming a hole penetrating through the stem portion 2 along its thickness and coating the hole with a metal film.

Figure 7:
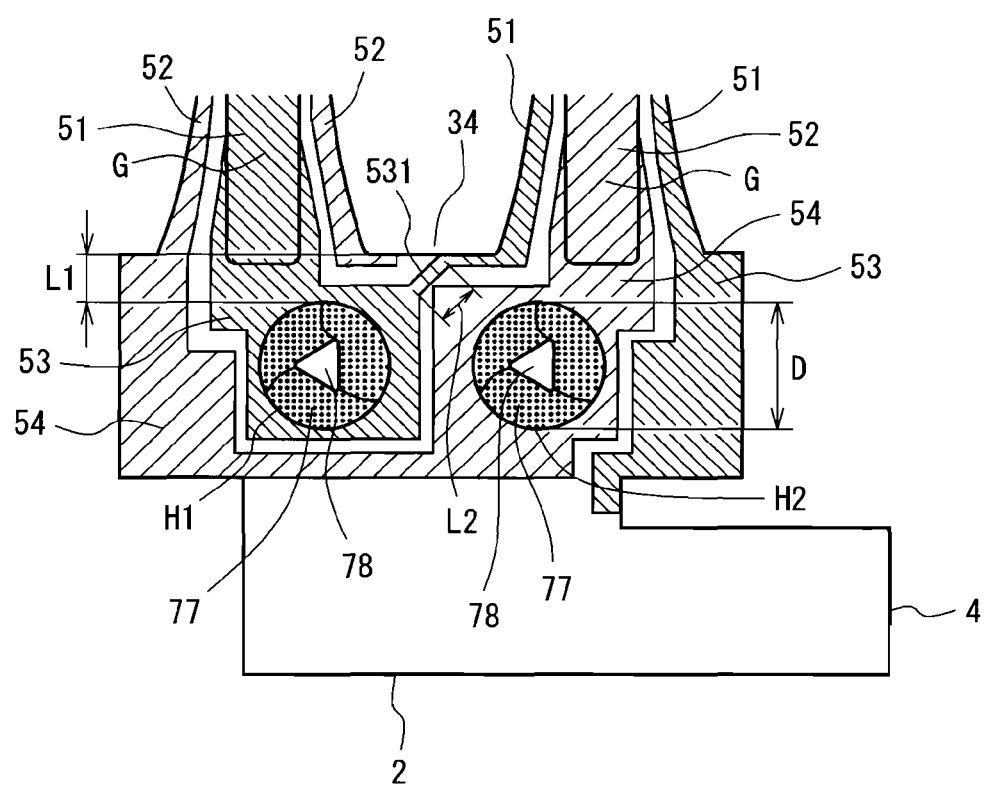
FIG. 7 is a schematic plan view of an enlarged part of the illustration of FIG. 3.

The shape of the through hole H1, H2 in plan view on the front and back sides of the stem portion 2, specifically, the shape at the opening end of the hole H1, H2 is a substantially circular shape. In this embodiment, diameters D of the substantially circular through holes H1 and H2, i.e., opening diameters D, are both, for example, 0.065 mm and thus equal to each other, as illustrated in FIG. 7 which is an enlarged, schematic plan view of the vicinity of the stem portion 2 of FIG. 3. The opening diameter D may preferably be 0.05 mm to 0.08 mm in view of reliable electrical conduction required of the through electrode and downsizing of the vibration piece 1. If the opening diameter D is less than 0.05 mm, the through hole may fail to penetrate through the stem portion 2 and accordingly fail to serve as a conduction path. If the opening diameter is more than 0.08 mm, the through hole may be too large in area relative to the stem portion 2, which is likely to cause cracking and/or invite breakage of electrical connection.

In this embodiment, the thickness t of the stem portion 2 is 80 μm. The following is preferable values of an aspect ratio (t/D); ratio of the thickness t of the stem portion 2 to the opening diameter D of the through hole.

Because the values of 0.05 mm (50 μm) to 0.08 mm (80 μm) may be the preferable numeral range of the opening diameter D, the aspect ratio (t/D) may preferably be 1.0 to 1.6.

When the opening diameter D is 65 μm; center value, the aspect ratio t/D is 80/65=1.23.

A distance L1 between a virtual line extending along an end surface of a crotch part 34 and another virtual line passing through an upper end of the through hole H1, H2 and extending in parallel to the virtual line may be, for example, 0.03 to 0.04 mm.

Because the crystal wafer (Z plate) has crystal anisotropy, erosion advances during wet etching at a crystal-specific angle of inclination. Therefore, the surface of an inner wall of the through hole H1, H2 has an inclined surface 77, as illustrated in FIG. 7, and an opening 78 has, for example, a substantially triangular shape in plan view, with the opening diameter being reduced inward.

As a result of the wet etching additionally performed to form the elongated grooves G, a surface continuous from the main surface of the stem portion 2 near the opening end of the through hole toward inside of the through hole is inclined in multiple levels. This may allow a moderate angle shift at edges of the inclined surface continuous from the main surface of the stem portion toward inside of the through hole, which may effectively prevent breakage of the metal film (electrodes being broken) on the inner wall surface near the opening end of the through hole In this embodiment, the main surface electrode 51 on the front side of the vibrating arm 31 illustrated in FIG. 3 is extracted through the extraction electrode 53 to the peripheral area of the through hole H1 of the stem portion 2, and is electrically coupled via the through hole H1 to the main surface electrode 51 on the back side of the vibrating arm 31 illustrated in FIG. 4.

The main surface electrode 51 on the front side of the vibrating arm 31 illustrated in FIG. 3 is extracted from the peripheral area of the through hole hl to the side surface electrode 51 on the inner side surface of the vibrating arm 32 through a routing wiring 531 formed by way of the crotch part 34 between roots of the vibrating arms 31 and 32, and is electrically coupled to the side surface electrode 51.

The routing wiring 531 with a greater path length may involve a higher risk of breakage of electrical connection. In this embodiment, therefore, the routing wiring 531 is extracted slantwise from the extraction electrode 53 in the peripheral area of the through hole H1 to the electrode of the crotch part 34 so as to minimize the path of the routing wiring 53, which may reduce the risk of breakage of electrical connection.

The length and width of the routing wiring 531 depends on the distance L1 between a virtual line extending along an end surface of the crotch part 34 illustrated in FIG. 7 and another virtual line passing through an upper end of the through hole H1, H2 and extending in parallel to the virtual line.

The routing wiring 531 may preferably have a smaller length, as described earlier. In this embodiment, therefore, the routing wiring 531 extending slantwise as illustrated in FIG. 7 has a length L2 of 0.03 mm or less.

The routing wiring 531 may preferably have a greater width in view of preventability of breakage of electrical connection. On the other hand, the routing wiring 531 may preferably be thinner in view of preventability of short circuit with the extraction electrode 54 in the peripheral area of the heteropolar through hole H2 adjacently formed. In this embodiment, therefore, the routing wiring 531 has a width of 0.02 mm to 0.04 mm from the aspects of short circuit and breakage of electrical connection.

The side surface electrode 51 on the inner side surface of the vibrating arm 32 coupled to the main surface electrode 51 on the front side of the vibrating arm 31 through the routing wiring 531 is extracted to and electrically coupled to the side surface electrode 51 on the outer side surface of the vibrating arm 32, as described earlier. As illustrated in FIG. 4, the side surface electrode 51 on the outer side surface of the vibrating arm 32 is electrically coupled to the main surface electrode 51 on the back side of the vibrating arm 31 through the extraction electrode 53 on the back side.

Thus, the main surface electrode 51 on the front side of the vibrating arm 31 is electrically coupled to the main surface electrode 51 on the back side of the vibrating arm 31 via the through hole H1, and is also electrically coupled to the main surface electrode 51 on the back side of the vibrating arm 31 through the routing wiring 531 formed by way of the crotch part 34 and the side surface electrode 51 of the vibrating arm 32.

On a path passing through the through hole H1, the main surface electrode 51 on the front side of the vibrating arm 31 is electrically coupled to the main surface electrode 51 on the back side of the vibrating arm 31. On a path passing through the routing wiring 531 formed in the vicinity of the crotch part 34, the main surface electrode 51 on the front side of the vibrating arm 31 is electrically coupled to the main surface electrode 51 on the back side of the vibrating arm 31 through the side surface electrode 51 of the vibrating arm 32.

Similarly to the main surface electrode 51 on the front side of the vibrating arm 31, the main surface electrode 52 on the back side of the vibrating arm 32 is extracted through the extraction electrode 54 to the peripheral area of the through hole H2, and is electrically coupled to the main surface electrode 52 on the front side of the vibrating arm 32 via the through hole H2, as illustrated in FIG. 4.

The main surface electrode 52 on the back side of the vibrating arm 32 illustrated in FIG. 4 is extracted to and electrically coupled to the side surface electrode 52 on the inner side surface of the vibrating arm 31 through a routing wiring 541 formed slantwise by way of the crotch part 34 between roots of the vibrating arms 31 and 32. The length and width of the routing wiring 541 are similar to those of the routing wiring 531.

The side surface electrode 52 on the inner side surface of the vibrating arm 31 is extracted to and electrically coupled to the side surface electrode 52 on the outer side surface of the vibrating arm 31, as described earlier. As illustrated in FIG. 3, the side surface electrode 52 on the outer side surface of the vibrating arm 31 electrically coupled to the main surface electrode 52 on the front side of the vibrating arm 32 through the extraction electrode 54 on the front side.

Thus, the main surface electrode 52 on the back side of the vibrating arm 32 is electrically coupled to the main surface electrode 52 on the front side of the vibrating arm 32 via the through hole H2, and is also electrically coupled to the main surface electrode on the front side of the vibrating arm 32 through the routing wiring 541 formed by way of crotch part 34 and the side surface electrode 52 of the vibrating arm 31.

On a path passing through the through hole H2, the main surface electrode 52 on the back side of the vibrating arm 32 is electrically coupled to the main surface electrode 52 on the front side of the vibrating arm 32. On a path passing through the routing wiring 541 formed in the vicinity of the crotch part 34, the main surface electrode 52 on the back side of the vibrating arm 32 is electrically coupled to the main surface electrode 51 on the front side of the vibrating arm 32 through the side surface electrode 52 of the vibrating arm 31.

As illustrated in FIG. 3, the extraction electrode 53, 54 is extracted from one end side 21 of the stem portion 2 to the narrower part 79 on the front-surface side of the vibration piece 1. On the other hand, the extraction electrode 53, 54 is extracted to the other end side 22 and an edge side of the protruding portion 4 on the back-surface side of the vibration piece 1, as illustrated in FIG. 4. On the back-surface side of the vibration piece 1, electrodes for connection 532 and 542 electromechanically coupled to the electrode pads 74 formed in a pair inside of the container 72 are provided in regions on the other end side 22 of the stem portion 2 and on the edge side of the protruding portion 4.

The conductive joining materials 62 and 61 are formed on upper surfaces of the two electrodes for connection 532 and 542. In this embodiment, the joining materials 61 and 62 are plated bumps formed by electrolytic plating. The vibration piece 1 and the electrode pads 74 are conductively joined to each other by the FCB (Flip Chip Bonding) method.

The technical features described thus far may ensure reliable electrical conduction between the main surface electrodes 51 and between the main surface electrodes 52 on the front and back sides of the vibrating arms 31 and 32, because of the following reasons:

the main surface electrodes 51 and the main surface electrodes 52 are electrically connected via the through holes H1 and H2 which are electrodes penetrating through the front and back surfaces of the stem portion 2;

one of the main surface electrodes 51 and one of the main surface electrodes 52 on the front and back sides are electrically coupled to the side surface electrodes 51 and 52 through the routing wirings 531 and 541 formed by way of the crotched part 34; and these side surface electrodes 51 and 52 are electrically coupled to the other ones of the main surface electrodes 51 and of the main surface electrodes 52.

Supposing that electrical conduction is destabilized or breakage of electrical connection occurs as a result of production variability in one of or both of the through holes H1 and H2, the routing wirings 531 and 541, which are conduction paths formed by way of the crotch part 34, may allow electrical connection to be maintained between the main surface electrodes 51 and between the main surface electrodes 52 on the front and back surfaces of the vibration piece 1.

In one or both of the paired routing wirings 531 and 541 formed by way of the crotch part 34, pattern displacement may possibly occur as a result of misregistration during photolithographic exposure. Such an event possibly destabilizes electrical conduction or invites breakage of electrical connection. Yet, the through holes H1 and H2 may allow electrical connection to be maintained between the main surface electrodes 51 and between the main surface electrodes 52 on the front and back surfaces of the vibration piece 1.

Figure 8:
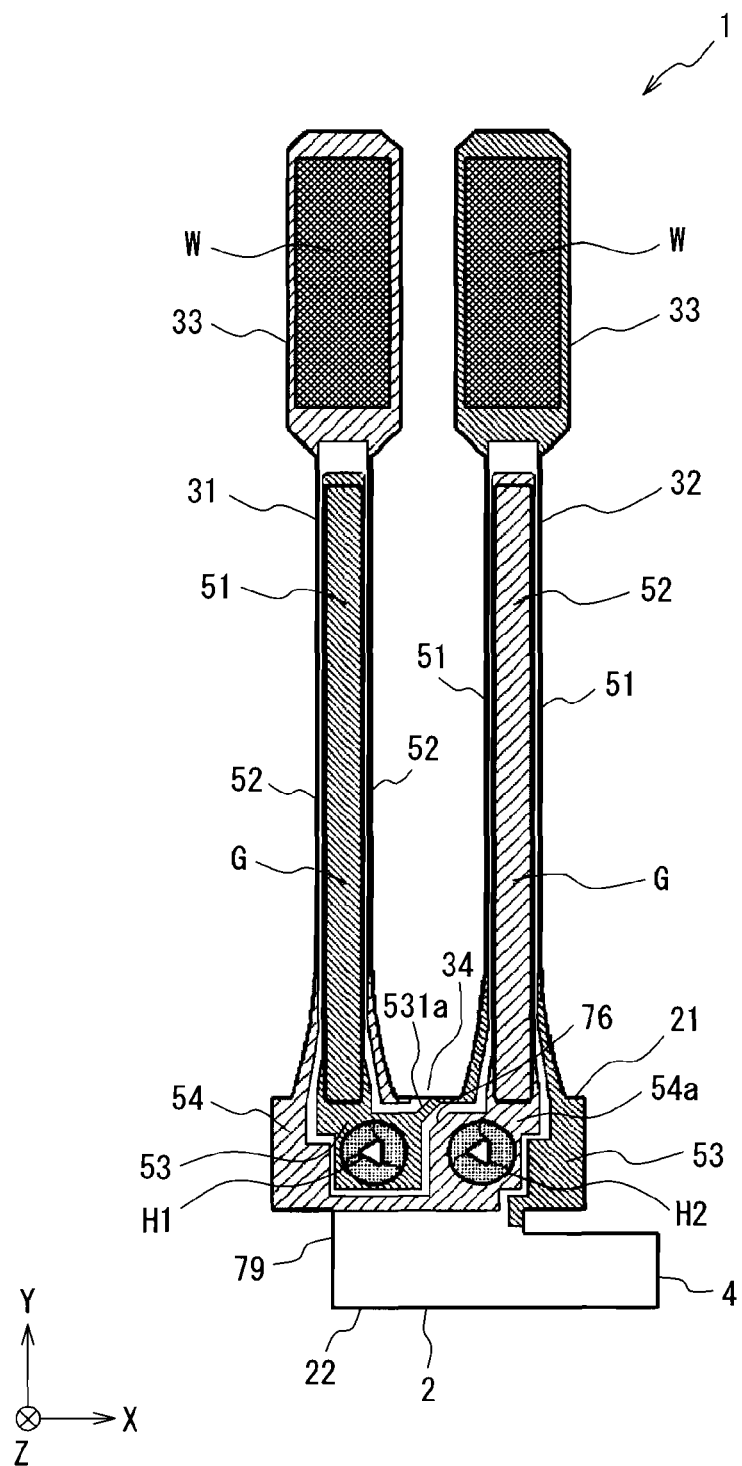
FIG. 8 is a schematic plan view, illustrated correspondingly to FIG. 3, of a tuning fork-type crystal vibration piece according to another embodiment of the present invention.
Figure 9:
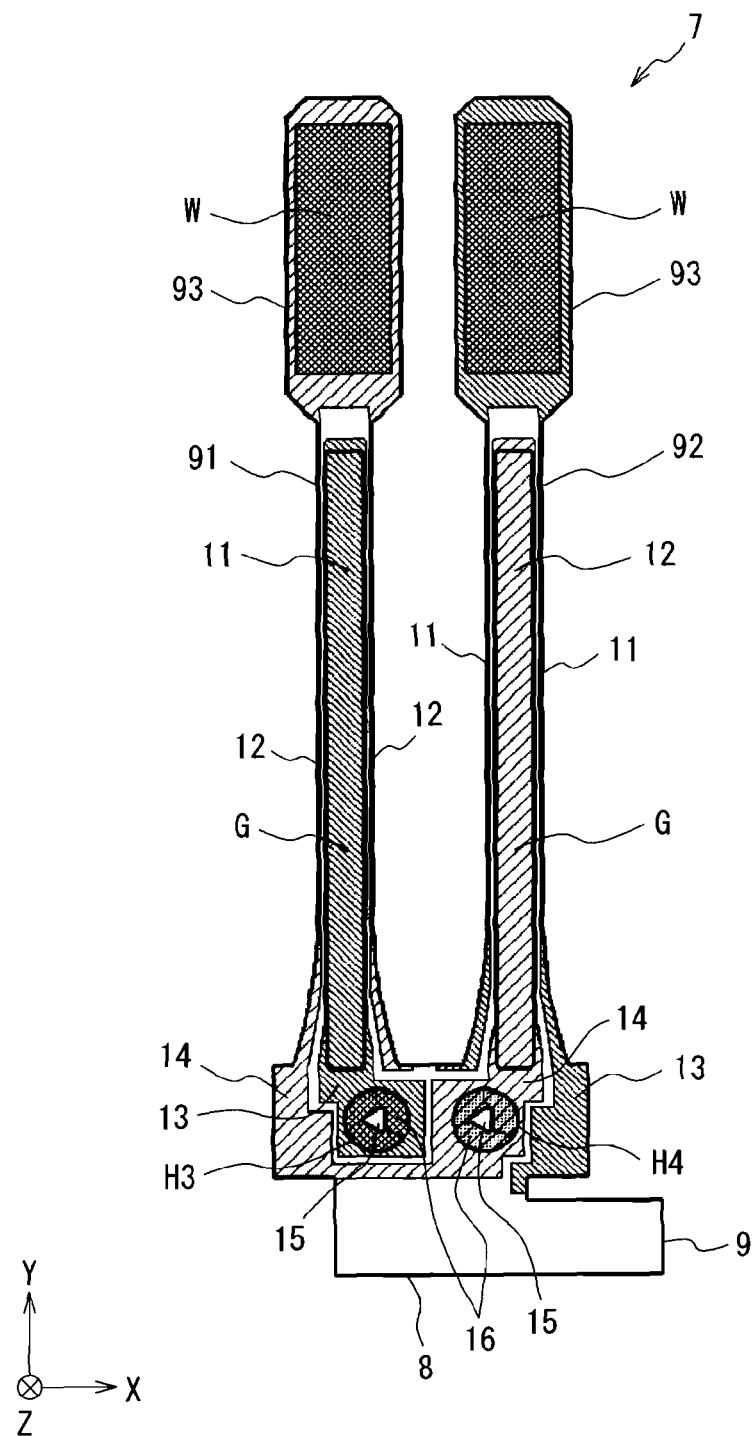
FIG. 9 is a schematic plan view of one main surface side of a tuning fork-type crystal vibration piece of the known art.

FIG. 8 is a schematic plan view, illustrated correspondingly to FIG. 3, of the front-surface side of a tuning fork-type crystal vibration piece according to another embodiment of the present invention.

In this embodiment, a routing wiring 531a formed by way of the crotch part 34 is greater in width than the routing wiring 531 of the earlier embodiment to more effectively prevent breakage of electrical connection.

Also, this embodiment forms a chamfered part 76 in a right-angled corner of an extraction electrode 54a adjacent to the routing wiring 531a. The chamfered 76 extends in parallel to the routing wiring 531a extending slantwise.

The chamfered part 76 at the right-angled corner of the extraction electrode 54a adjacent to the routing wiring 531a provides a greater interval between the routing wiring 531a and the adjacent extraction electrode 54a than between the routing wiring 531 and a corner of the adjacent extraction electrode 54 in the earlier embodiment. This may more effectively prevent possible short circuit between the routing wiring and the adjacent extraction electrode.

On the back-surface side, the routing wiring formed by way of the crotch part 34 is increased in width as well as on the front-surface side, as compared with the routing wiring 541 of the earlier embodiment, and a chamfered part is formed at a right-angled corner of the electrode 53 adjacent to the routing wiring 541.

Any other technical aspects are similar to those described in the earlier embodiment.

The present invention may be variously modified without departing the technical spirit and features described herein. The embodiments described thus far are to be considered in all respects as illustrative and not restrictive. The scope of the present invention is solely defined by the appended claims, rather than by the description of this specification, and all changes which come within the meaning and range of equivalency of the appended claims are, therefore, embraced therein.

INDUSTRIAL APPLICABILITY

The present invention is applicable to mass production of tuning fork-type vibrators.

REFERENCE SIGNS LIST 1 tuning fork-type vibrator
2 stem portion
31, 32 vibrating arm
H1, H2 through hole (through electrode)
34 crotch part
51 first driving electrode
52 second driving electrode
531, 541 routing wiring

The invention claimed is:

1. A tuning fork-type piezoelectric vibration piece, comprising:
a stem portion; and
first and second vibrating arms formed so as to extend in a pair in a direction from one end side of the stem portion,
one of main surface electrodes formed on main surfaces on front and back sides of the first vibrating arm being coupled to another one of the main surface electrodes formed on the main surfaces of the first vibrating arm through one of through electrodes that are formed in a pair in the stem portion in a direction of thickness thereof,
the one of the main surface electrodes of the first vibrating arm being coupled to side surface electrodes that are formed in a pair, respectively, on an outer side surface and an inner side surface of the second vibrating arm through a first routing wiring formed by way of a crotch part between roots of the first and second vibrating arms extending from the stem portion,
the first routing wiring being formed on an end surface of the crotch part from the side surface electrode on the inner side surface of the second vibrating arms, the first routing wiring extending toward the first vibrating arm along the end surface of the crotch part, and the first routing wiring being connected to an extraction electrode around the one of through electrodes,
one of main surface electrodes formed on main surfaces on front and back sides of the second vibrating arm being coupled to another one of the main surface electrodes of the second vibrating arm through another one of the through electrodes, the one of the main surface electrodes of the second vibrating arm being formed on the main surface on one of the front and back sides opposite to the front or back side where the one of the main surface electrodes of the first vibrating arm is formed,
the one of the main surface electrodes of the second vibrating arm being coupled to side surface electrodes that are formed in a pair, respectively, on an outer side surface and an inner side surface of the first vibrating arm via a second routing wiring formed by way of the crotch part,
the another one of the main surface electrodes of the first vibrating arm being coupled to the side surface electrodes on the outer and inner side surfaces of the second vibrating arm,
the second routing wiring being formed on an end surface of the crotch part from the side surface electrode on the inner side surface of the first vibrating arm, the second routing wiring extending toward the second vibrating arm along the end surface of the crotch part, and the second routing wiring being connected to an extraction electrode around the another one of through electrodes,
the another one of the main surface electrodes of the second vibrating arm being coupled to the side surface electrodes on the outer and inner side surfaces of the first vibrating arm, and
the shape of the through holes in plan view on the front and back sides of the stem portion being substantially circular, the opening diameter of the through holes being 0.05 mm to 0.08 mm.

2. The tuning fork-type piezoelectric vibration piece according to claim 1, wherein the through electrodes formed on front and back main surfaces of the stem portion have a substantially circular shape in plan view.

3. A tuning fork-type piezoelectric vibrator, comprising:
the tuning fork-type piezoelectric vibration piece according to claim 1; and
a package in which the tuning fork-type piezoelectric vibration piece is housed, wherein
the tuning fork-type piezoelectric vibration piece comprises electrodes for connection extracted from driving electrodes including the main surface electrodes and the side surface electrodes of the first and second vibrating arms,
the electrodes for connection are conductively coupled to electrodes mounted in a base constituting the package, and
the tuning fork-type piezoelectric vibration piece is airtightly sealed in the package.

* * * * *